(12) United States Patent
Borgharkar (10) Patent No.: US 11,592,597 B2
(45) Date of Patent: Feb. 28, 2023

(54) ANTI-REFLECTIVE SPUTTERING STACK WITH LOW RV AND LOW RUV

(71) Applicant: ESSILOR INTERNATIONAL, Charenton le Pont (FR)

(72) Inventor: Narendra Borgharkar, Dallas, TX (US)

(73) Assignee: Essilor International, Charenton-le-Pont (FR)

( * ) Notice: Subject to any disclaimer, the term of this patent is extended or adjusted under 35 U.S.C. 154(b) by 672 days.

(21) Appl. No.: 15/560,119

(22) PCT Filed: Mar. 25, 2015

(86) PCT No.: PCT/IB2015/000497
§ 371 (c)(1),
(2) Date: Sep. 20, 2017

(87) PCT Pub. No.: WO2016/151348
PCT Pub. Date: Sep. 29, 2016

(65) Prior Publication Data
US 2018/0100952 A1 Apr. 12, 2018

(51) Int. Cl.
*G02B 1/115* (2015.01)
*C23C 14/08* (2006.01)
(Continued)

(52) U.S. Cl.
CPC ............. *G02B 1/115* (2013.01); *C23C 14/08* (2013.01); *C23C 14/34* (2013.01); *G02B 5/208* (2013.01);
(Continued)

(58) Field of Classification Search
CPC ........ G02B 1/115; G02B 5/283; G02B 5/208; G02B 1/105; G02B 1/11; G02B 1/111; G02C 7/10; G02C 7/02; B29D 11/00865; C23C 14/08; C23C 14/34; C23C 14/081; C23C 14/083; C23C 14/3464; C23C 14/0652; C23C 14/10
USPC ............. 351/44–49; 359/350, 359–360, 577, 359/580–581, 585–589; 204/192.1–192.37
See application file for complete search history.

(56) References Cited

U.S. PATENT DOCUMENTS 6,551,710 B1 * 4/2003 Chen ..................... G02B 1/14
428/412
6,680,125 B1 * 1/2004 Sasaki .................... G02B 1/111
428/423.1
(Continued)

FOREIGN PATENT DOCUMENTS

EP 1494049 A2 * 1/2005 ............ B32B 27/36
FR 2734827 12/1996
(Continued)

*Primary Examiner* — Collin X Beatty
(74) *Attorney, Agent, or Firm* — Norton Rose Fulbright US LLP (57) ABSTRACT

The present invention provides a UV antireflective coating stack for ophthalmic lenses. The antireflective coating stack is deposited by sputtering, which lowers the reflectivity of the antireflective stack in the UV range and maintains low reflectivity in the visible range. The antireflective coating stack offers improved thermo-mechanical performance as compared to evaporation-based UV antireflective stacks.

18 Claims, 2 Drawing Sheets

(51) Int. Cl.
    *G02B 5/28*     (2006.01)
    *C23C 14/34*     (2006.01)
    *G02B 5/20*     (2006.01)
    *G02C 7/10*     (2006.01)
    *C23C 14/06*     (2006.01)
    *C23C 14/10*     (2006.01)

(52) U.S. Cl.
    CPC ............... *G02B 5/283* (2013.01); *G02C 7/10* (2013.01); *C23C 14/0652* (2013.01); *C23C 14/081* (2013.01); *C23C 14/083* (2013.01); *C23C 14/10* (2013.01); *C23C 14/3464* (2013.01)

(56) References Cited

U.S. PATENT DOCUMENTS

| | | | | |
|---|---|---|---|---|
| 6,713,170 | B1* | 3/2004 | Kaneko | G02B 1/111 428/212 |
| 9,709,705 | B2* | 7/2017 | Amano | G02B 1/11 |
| 2008/0084535 | A1* | 4/2008 | De Ayguavives | G02C 7/02 351/159.65 |
| 2008/0261008 | A1 | 10/2008 | Kiyokawa et al. | |
| 2009/0053351 | A1* | 2/2009 | Widman | G02C 7/04 425/174.4 |
| 2012/0013845 | A1* | 1/2012 | Conte | G02B 1/11 351/159.62 |
| 2012/0028005 | A1* | 2/2012 | Zheng | G02B 1/115 428/212 |
| 2012/0276350 | A1* | 11/2012 | Terayama | G02B 1/115 428/212 |
| 2012/0293768 | A1 | 11/2012 | Lapprand | |
| 2013/0038834 | A1* | 2/2013 | Cado | G02B 1/11 351/159.62 |
| 2013/0155373 | A1* | 6/2013 | Cado | G02B 1/11 351/159.62 |
| 2014/0078589 | A1* | 3/2014 | Fujii | G02B 1/11 359/601 |
| 2015/0009556 | A1 | 1/2015 | Kawagishi et al. | |

FOREIGN PATENT DOCUMENTS

| | | |
|---|---|---|
| FR | 2943798 | 10/2010 |
| WO | WO 2004/111691 | 12/2004 |
| WO | WO2012/076714 | 6/2012 |

\* cited by examiner

Figure 2

ANTI-REFLECTIVE SPUTTERING STACK WITH LOW RV AND LOW RUV

CROSS-REFERENCE TO RELATED APPLICATIONS

This application is a national phase application under 35 U.S.C. § 371 of International Application No. PCT/IB2015/000497 filed 25 Mar. 2015. The entire contents of the above referenced disclosure is specifically incorporated by reference herein without disclaimer.

FIELD OF THE INVENTION

This invention relates to ophthalmic lenses with an antireflective layer on their rear (concave) side.

BACKGROUND

Ophthalmic lenses such as spectacles and sunglasses generally block potentially harmful ultraviolet (UV) light from passing through the lens and reaching the wearer's eyes. Reduction of UV light transmission is especially important in sunwear applications, where dimness-induced mydriasis results in increased transmission of UV light through dilated pupils.

Although such lenses aid in reducing UV light transmitted to the eye, potentially harmful UV light may reach a spectacle wearer's eyes through other paths. Peripheral light may reach the eye unobscured and unfiltered by lens coatings. Light may also be reflected off the rear of a lens and reach the eye. Reflected light is a source of potentially harmful UV light that has long been overlooked.

Recently, there has been developed and launched ophthalmic lenses bearing an antireflective (AR) coatings on their rear (concave) side with low reflectivity in both visible and UV wavelengths. This recent advancement in ophthalmic lens technology protects the eyes of a wearer against reflected UV light coming from the rear. Concave-coated lenses limit the reflection of UV light at specific angles of incidence, typically at 30° to 45° incidence. Examples of such lenses are described in WO2012076714.

One aim of aspects of the present invention is to improve the thermomechanical performance of concave-coated AR lenses efficient in the UV wavelengths. One thermomechanical property of AR-coated ophthalmic lenses is critical temperature; this is the temperature at which an AR-coated lens begins to develop cracks. Improved critical temperature is an important advantage in the day to day use of eyewear. It is exceedingly important in sunwear applications where AR-coated lenses are exposed to relatively high temperatures for extended periods of time. Another aim of aspects of the present invention is to concurrently achieve favorable AR properties in the visible and UV ranges while maintain a high critical temperature.

Several technical solutions are available for improving the critical temperature of AR coatings. Disadvantages associated with these techniques is that they restrict the choice of material and increase the thickness of layers in an AR coating stack. As a consequence, the pool of practical AR coating layer candidates is reduced.

The coating-deposition protocol might have a significant impact on the effectiveness of the deposited AR coating. It is an aim of aspects of the present invention to produce robust AR coating stacks with mean light reflection factor in the visible region (Rv), colorimetric properties, and mean reflection factor in the UV range (Ruv) that are less sensitive to slight modifications in deposition protocol. Robustness is the ability of a lens to resist variations induced by the coating process.

Another aim of the present invention is to improve abrasion resistance and or scratch resistance (either by a common steel wool test or by a scratching test using a nanoindentation apparatus).

SUMMARY

An aim of aspects of the present invention is to improve the thermomechanical performance of lenses having on their back side a coating that reduces UV reflection. A UV antireflective coating stack applied to ophthalmic lenses by a sputtering process offers advantages not offered by evaporation-based UV antireflective stacks. It has been found that coating deposition by a sputtering process results in a higher critical temperature. An antireflective stack of the invention deposited by sputtering decreases reflection in the UV range and the visible range and offers improved thermomechanical properties as compared to evaporation-based antireflective stacks.

Unless otherwise specified, the refractive indexes referred to in the present application are expressed at 25° C. at a wavelength of 550 nm.

Figure 2:
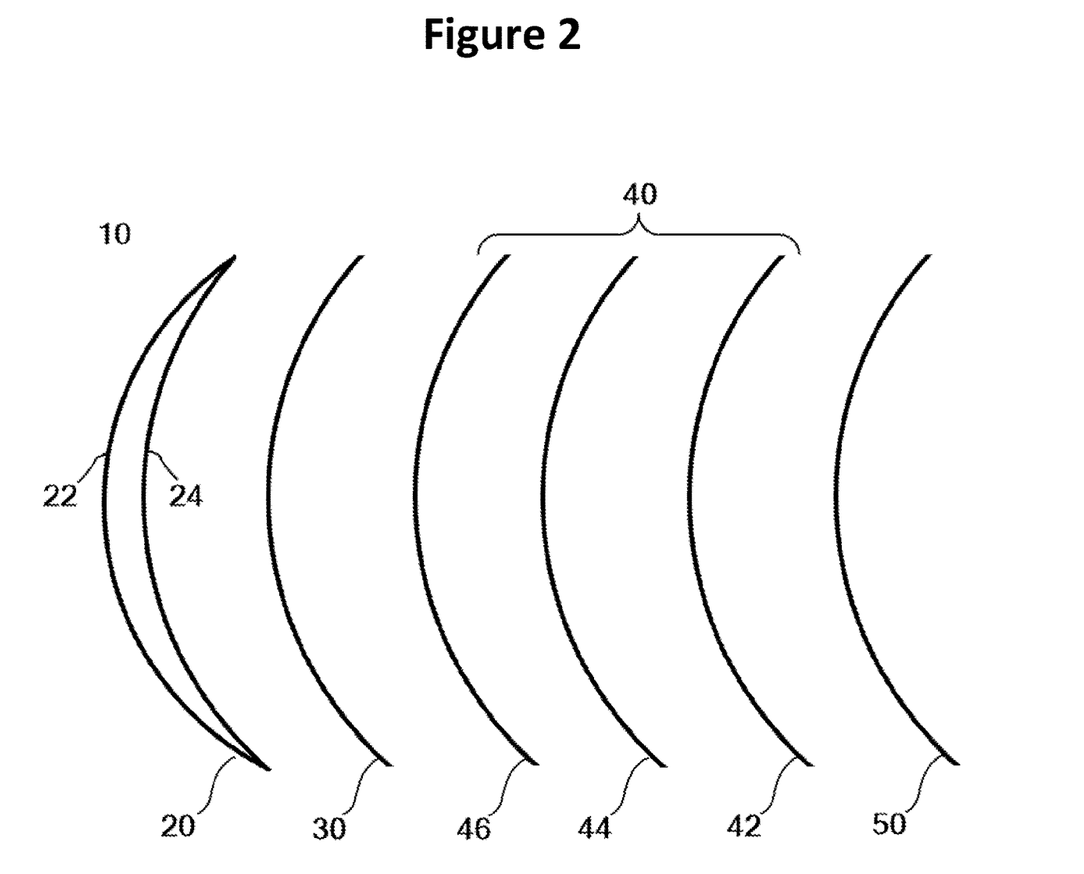
FIG. 2 is an exploded sectional view illustrating an embodiment of an ophthalmic lens as disclosed herein.

In some aspects, the present invention provides an ophthalmic lens 10 comprising a transparent substrate 20 with a front face 22 and a rear face 24, the rear face 24 being coated with a multilayered antireflective coating 40. In particular embodiments, the multilayered antireflective coating 40 is deposited by sputtering. The multilayered antireflective coating of the invention comprises a stack of at least one layer with a high refractive index and of at least one layer with a low refractive index. In some embodiments, the multilayered antireflective coating comprises a stack of at least one layer A 42 having a refractive index $n_A$ lower than or equal to 1.55, and of at least one layer B 44 having a refractive index $n_B$ higher than 1.55, with a mean light reflection factor of the rear face in the visible region Rv lower than 2%, and a mean reflection factor in the range 280 nm to 380 nm Ruv of the rear face lower than 5% for an angle of incidence of 35°. The ophthalmic lens has a critical temperature higher than or equal to 60° C., in some aspects.

The ophthalmic lens may further comprise a sublayer 30, deposited before the multilayered antireflective coating, said sublayer having a refractive index nsub lower than or equal to 1.55. The sublayer 30 may be deposited by sputtering or chemical vapor deposition (CVD).

According to one embodiment, the sublayer is deposited on the lens substrate either coated or uncoated. In an embodiment, the sublayer is deposited on the lens substrate already coated by an abrasion resistant coating.

The sublayer is generally less than 0.5 micrometer thick and more than 100 nm thick, preferably more than 150 nm thick, more preferably the thickness of the sublayer ranges from 150 nm to 450 nm. In another embodiment, the sublayer comprises, more preferably consists in silicon oxide, more preferably silica. Usable sublayers (mono or multilayered) are described in WO2012076174.

In some embodiments, the ophthalmic lens comprises a mean light reflection factor of the rear face in the visible region (Rv) that ranges from 0.5% to 2.5%. In particular embodiments, the ophthalmic lens comprises a mean light reflection factor of the rear face in the visible region (Rv) that ranges from 0.9% to 2%. In further embodiments, the mean light reflection factor of the rear face in the visible region ranges from greater than 1% to 2%. In a particular embodiment, the mean light reflection factor of the rear face in the visible region is lower than or equal to 1.6%.

In some embodiments, the ophthalmic lens comprises a multilayer antireflective coating with a hue angle ranging from 275° to 325° at an angle of incidence of 15°. In some aspects of the invention, the ophthalmic lens rear face antireflection coating chroma is lower than 15 for an angle of incidence of 15°. In some embodiments, the ophthalmic lens multilayer antireflective coating 40 comprises outermost layer A 42, and layer B 44 adjacent to outermost layer A 42. The phrase "adjacent to" may be understood to mean contiguous, or touching. In certain embodiments, the thickness of outermost layer A is lower than adjacent layer B 44. In some aspects of the invention, layer A 42 comprises at least one oxide chosen from silicon oxide, silica, mixtures of silicon oxide, and alumina. In some embodiments, layer B 44 comprises at least one material selected from the group consisting of zirconia ($ZrO_2$), titanium dioxide ($TiO_2$), tantalum pentoxide ($Ta_2O_5$), niobium oxide ($Nb_2O_5$), alumina ($Al_2O_3$), praseodymium oxide ($Pr_2O_3$), praseodymium titanate ($PrTiO_3$), silicon nitride and silicon oxynitride. In a particular embodiment, layer B 44 comprises a silicon nitride such as $Si_3N_4$. In a particular embodiment, a first layer comprises $Si_3N_4$ and is of greater thickness than a second layer. The ophthalmic lens multilayer antireflective coating may further comprise a layer C 46 having a refractive index $n_C$, wherein layer A 42 is the outermost layer, layer B 44 is an intermediate layer, and layer C 46 is the innermost layer, and $n_C$ is higher than 1.55 and lower than $n_B$.

Certain embodiments of the invention are directed to an ophthalmic lens multilayer antireflective coating stack comprising layers A and B, wherein $n_A$ ranges from 1.45 to 1.50 and $n_B$ ranges from 1.70 to 2.60. In a preferred embodiment, $n_B$ ranges from 1.95 to 2.60. In a further embodiment, the ophthalmic lens further comprises layer C 46, wherein $n_C$ ranges from 1.55 to 1.90, and nB-nc is greater than or equal to 0.15. In one embodiment, the multilayer antireflective coating comprises 7 or less layers. In some embodiments, the multilayer antireflective coating stack comprises 5 layers. In other embodiments, the multilayer antireflective coating stack comprises 4 or fewer layers. In further embodiments, the multilayer antireflective coating stack comprises 6 or more than 6 layers.

As used herein, a layer of the antireflective coating is defined as having a thickness higher than or equal to 1 nm. Thus, any layer having a thickness lower than 1 nm will not be considered when counting the number of layers in the antireflective coating. The sub-layer either is not considered when counting the number of layers of the antireflective coating.

In some aspects of the invention, the ophthalmic lens further comprises a hard-coat 50 having a refractive index less than or equal to 1.8, or less than or equal to 1.6. In a further embodiment, the hard-coat 50 refractive index is less than 1.55. In a particular embodiment, the hard-coat 50 refractive index is less than 1.5.

In another particular embodiment, the hard coat 50 is prepared from compositions comprising at least one alkoxysilane, preferably an epoxysilane and/or a hydrolyzate thereof.

The thickness of the hard coat does generally vary from 2 to 10 micrometers, preferably from 3 to 5 micrometers.

Some aspects of the invention are directed towards a method for manufacturing an ophthalmic lens, comprising the steps of providing a transparent substrate with a front face and a rear face, applying by sputtering a multilayered antireflective coating comprising a stack of at least one layer having a refractive index less than or equal to 1.55, at least one layer having a refractive index greater than 1.55, and recovering said optical article having a mean light reflection factor on the rear face in the visible region (Rv) is less than 2%, and a mean reflection factor in the range 280 nm to 380 nm (Ruv) on the rear face less than 5% for an angle of incidence of 35°.

In some embodiments of the invention, multilayer antireflective coating stack thermomechanical properties, including abrasion, may be adjusted by altering the ratio of low index layer thickness to high index layer thickness. The stack thermomechanical properties are also adjusted by modifying the nature of the materials used in the stack, for example, by using as low index layers silicon oxide layers, preferably silica layers that contain a low ratio of alumina (typically from 1 to 10% by weight).

In one embodiment, a multilayer antireflective stack comprises a low refractive index layer that is thinner than a higher refractive index layer. This differential thickness of low and high refractive index layers provides advantageous mean light reflection factors in both the visible and UV ranges.

In some embodiments, a layer with an intermediate refractive index is incorporated into a multilayer antireflective stack to give a three-layer antireflective stack comprising low, intermediate and high refractive index layers.

In some embodiments, the hue value or values of one or more layers of a multilayer antireflective coating stack are adjusted to reduce mean light reflection factors in the visible range and while preserving a desired Ruv value. In Example 2, hue is adjusted to reduce Rv value.

In one embodiment, the refractive index of a hardcoat or UV coating is selected to improve Ruv performance while maintaining Rv performance. In some embodiments, the AR stack provides lower reflection in the UV range while maintaining 1.25%<Rv<2.0%. In aspects of the invention, AR stacks provide advantageous color robustness and visibly apparent distinct residual reflection color.

In the present application, when an optical article comprises one or more coatings onto the surface thereof, the expression "to deposit a layer or a coating onto the article" is intended to mean that a layer or a coating is deposited onto the external (exposed) surface of the outer coating of the article, that is to say, the coating that is the most distant from the substrate.

A coating, that is said to be "on" a substrate or deposited "onto" a substrate is defined as a coating, which (i) is positioned above the substrate, (ii) is not necessarily (although it is preferably) in contact with the substrate, that is to say one or more intermediate coatings may be arranged between the substrate and the coating in question, and (iii) does not necessarily completely cover the substrate.

In a preferred embodiment, the coating on a substrate or deposited onto a substrate is in direct contact with this substrate.

When "a layer B is lying under a layer A", it is intended to mean that layer A is more distant from the substrate than layer B.

As used herein, the rear (or the inner) face of the substrate is intended to mean the face which, when using the article, is the nearest from the wearer's eye. It is generally a concave face. On the contrary, the front face of the substrate, is the face which, when using the article, is the most distant from the wearer's eye. It is generally a convex face.

Generally speaking, the antireflective coating of the optical article according to the invention, which will be called the "anti-UV, antireflective coating", may be deposited onto any substrate, and preferably onto organic lens substrates, for example a thermoplastic or thermosetting plastic material.

Thermoplastic materials to be suitably used for the substrates include (meth)acrylic (co)polymers, especially methyl poly(methacrylate) (PMMA), thio(meth)acrylic (co) polymers, polyvinylbutyral (PVB), polycarbonates (PC), polyurethanes (PU), poly(thiourethanes), polyol allylcarbonate (co)polymers, thermoplastic copolymers of ethylene/vinyl acetate, polyesters such as polyethylene terephthalate (PET) or polybutylene terephthalate (PBT), polyepisulfides, polyepoxides, polycarbonate/polyester copolymers, cycloolefin copolymers such as copolymers of ethylene/norbornene or ethylene/cyclopentadiene, and combinations thereof.

As used herein, a (co)polymer is intended to mean a copolymer or a polymer. As used herein, a (meth)acrylate is intended to mean an acrylate or a methacrylate. As used herein, a polycarbonate (PC) is intended to mean either homopolycarbonates or copolycarbonates and block copolycarbonates.

Particularly recommended substrates include those substrates obtained through (co)polymerization of the diethyleneglycol bis-allyl-carbonate, marketed, for example, under the trade name CR-39® by the PPG Industries company (ORMA® lenses, ESSILOR), or through polymerization of the thio(meth)acrylate monomers, such as those described in the application of the French patent FR 2 734 827. The substrates may be obtained through polymerization of the above monomer combinations, or may further comprise mixtures of such polymers and (co)polymers.

Prior to depositing the antireflective coating onto the optionally coated substrate, for example with an abrasion-resistant layer and/or a scratch-resistant coating and/or with a sub-layer, the surface of said optionally coated substrate is usually submitted to a physical or chemical surface activating treatment, so as to reinforce the adhesion of the antireflective coating. Such pre-treatment is generally conducted under vacuum. It may be a bombardment with energetic and/or reactive species, for example with an ion beam ("Ion Pre-Cleaning" or "I PC") or with an electron beam, a corona discharge treatment, an ion spallation treatment, an ultraviolet treatment or a plasma-mediated treatment under vacuum, generally using an oxygen or an argon plasma. It may also be an acid or basic treatment and/or a solvent-based treatment (water, hydrogen peroxide or any organic solvent).

In the present application, the "mean reflection factor," noted Rm, is such as defined in the ISO 13666:1998 Standard, and measured in accordance with the ISO 8980-4 Standard (for an angle of incidence lower than 17°, typically of 15°), i.e., this is the (non-weighted) spectral reflection average over the whole visible spectrum between 400 and 700 nm.

The "mean light reflection factor," noted Rv, is such as defined in the ISO 13666:1998 Standard, and measured in accordance with the ISO 8980-4 Standard (for an angle of incidence lower than 17°, typically of 15°), i.e. this is the weighted spectral reflection average over the whole visible spectrum between 380 and 780 nm. In the present application, Rv factors have been measured at an angle of incidence of 15°.

The mean reflection factor between 280 nm and 380 nm, weighted by the W(λ) function defined according to the ISO 13666:1998 Standard and noted Ruv, may be defined through the following relation:

$$Ruv = \frac{\int_{280}^{380} W(\lambda) \cdot R(\lambda) \cdot d\lambda}{\int_{280}^{380} W(\lambda) \cdot d\lambda}$$

wherein R(λ) represents the lens spectral reflection factor at a given wavelength, and W(λ) represents a weighting function equal to the product of the solar spectrum irradiance Es(λ) and the efficiency relative spectral function S(λ). In certain embodiments, this factor may be measured at an angle of incidence that ranges from 15° to '45°, from 30° to 45°. In a preferred embodiment, this factor is measured at an angle of incidence of 35°.

The spectral function W(λ), enabling to calculate the ultraviolet radiation transmission factors, is defined according to the ISO 13666:1998 Standard. It makes it possible to express the ultraviolet solar radiation distribution tempered by the relative spectral efficiency of such radiation for the wearer, since it simultaneously takes both the solar spectral energy Es(λ) into account, which does globally emit less UVB-rays as compared to UVA-rays, and the spectral efficiency S(λ), UVB-rays being more harmful than UVA-rays. The values for those three functions in the ultraviolet region are given in the following table:

| Wavelength λ (nm) | Solar spectrum irradiance Es(λ) (mW/m² · nm) | Efficiency relative spectral function S(λ) | Weighting function W(λ) = Es(λ) · S(λ) |
|---|---|---|---|
| 280 | 0 | 0.88 | 0 |
| 285 | 0 | 0.77 | 0 |
| 290 | 0 | 0.64 | 0 |
| 295 | 2.09 × 10⁻⁴ | 0.54 | 0.00011 |
| 300 | 8.10 × 10⁻² | 0.30 | 0.0243 |
| 305 | 1.91 | 0.060 | 0.115 |
| 310 | 11.0 | 0.015 | 0.165 |
| 315 | 30.0 | 0.003 | 0.09 |
| 320 | 54.0 | 0.0010 | 0.054 |
| 325 | 79.2 | 0.00050 | 0.04 |
| 330 | 101 | 0.00041 | 0.041 |
| 335 | 128 | 0.00034 | 0.044 |
| 340 | 151 | 0.00028 | 0.042 |
| 345 | 170 | 0.00024 | 0.041 |
| 350 | 188 | 0.00020 | 0.038 |
| 355 | 210 | 0.00016 | 0.034 |
| 360 | 233 | 0.00013 | 0.03 |
| 365 | 253 | 0.00011 | 0.028 |
| 370 | 279 | 0.000093 | 0.026 |
| 375 | 306 | 0.000077 | 0.024 |
| 380 | 336 | 0.000064 | 0.022 |

In one aspect of the invention, a multilayer antireflective coating stack for an ophthalmic lens is provided comprising the following layers (listed in order of proximity to a naked or coated substrate:

a first layer with a thickness ranging from 18-25 nm having a refractive index greater than 1.55;

a second layer with a thickness ranging from 15-20 nm having a refractive index lower than or equal to 1.55;

a third layer with a thickness ranging from 90-120 nm having a refractive index greater than 1.55; and a fourth layer with a thickness ranging from 65-80 nm having a refractive index lower than or equal to 1.55.

In some embodiments, the multilayer antireflective coating stack of the invention includes at least one electrically conductive layer. In a particular embodiment, the at least one electrically conductive layer has a refractive index greater than 1.55. The at least one electrically conductive layer serves as an antistatic agent. Without being bound by theory, the at least one electrically conductive layer prevents the multilayer antireflective coating stack from developing and retaining a static electric charge.

The ability for a glass to evacuate a static charge obtained after rubbing with a piece of cloth or using any other procedure to generate a static charge (charge applied by corona) may be quantified by measuring the time it takes for said charge to dissipate. Thus, antistatic glasses have a discharge time of about a few hundred milliseconds (ms), preferably 500 ms or less, whereas it is of about several tens of seconds for a static glass. In the present application, discharge times are measured according to the method disclosed in FR 2943798.

As used herein, an "electrically conductive layer" or an "antistatic layer" is intended to mean a layer which, due to its presence on the surface of a non-antistatic substrate (i.e. having a discharge time higher than 500 ms), enables to have a discharge time of 500 ms or less after a static charge has been applied onto the surface thereof.

The electrically conductive layer may be located on various places in the stack, generally in or in contact with the antireflective coating, provided the anti-reflective properties thereof are not affected. It is preferably located between two layers of the antireflective coating, and/or is adjacent to a layer with a high refractive index of such antireflective coating. Preferably, the electrically conductive layer is located immediately under a layer with a low refractive index, most preferably is the penultimate layer of the anti-reflective coating by being located immediately under a silica-based outer layer of the antireflective coating.

The electrically conductive layer should be thin enough not to alter the transparency of the antireflective coating. The electrically conductive layer is preferably made from an electrically conductive and highly transparent material, generally an optionally doped metal oxide. In this case, the thickness thereof preferably varies from 1 to 15 nm, more preferably from 1 to 10 nm. Preferably, the electrically conductive layer comprises an optionally doped metal oxide, selected from indium, tin, zinc oxides and mixtures thereof. Tin-indium oxide ($In_2O_3$:Sn, tin-doped indium oxide), aluminium-doped zinc oxide (ZnO:Al), indium oxide ($In_2O_3$) and tin oxide ($SnO_2$) are preferred. In a most preferred embodiment, the electrically conductive and optically transparent layer is a tin-indium oxide layer or a tin oxide layer. The optical article according to the invention may also comprise coatings formed on the antireflective coating and capable of modifying the surface properties thereof, such as hydrophobic and/or oleophobic coatings (antifouling top coat). These coatings are preferably deposited onto the outer layer of the antireflective coating. As a rule, their thickness is lower than or equal to 10 nm, does preferably range from 1 to 10 nm, more preferably from 1 to 5 nm. There are generally coatings of the fluorosilane or fluorosilazane type. They may be obtained by depositing a fluorosilane or fluorosilazane precursor, comprising preferably at least two hydrolysable groups per molecule. Fluorosilane precursors preferably comprise fluoropolyether moieties and more preferably perfluoropolyether moieties.

Optool DSX™, KY130™, OF210™, Aulon™ are examples of hydrophobic coatings. More detailed information on hydrophobic coatings is disclosed in WO 2012076714.

According to an embodiment of the invention, the anti-reflective coating of the invention is deposited by sputtering.

Sputtering is a method of physical vapor deposition (PVD) in which a plasma is used to bombard a target cathode with energetic gas ions from the plasma. Momentum transfer from the energetic gas ions dislodges atoms from the cathode and redeposits them on the substrate. Many sputtering technologies exist including DC sputtering, RF sputtering etc. Many types of materials including metals, oxides, nitrides, carbides etc. and their mixtures can be deposited by sputtering technology. DC sputtering technology is commonly used in the PVD industry especially where high deposition rates are needed. An apparatus that can be used is the SP 200™ apparatus from Satisloh.

The SP200 sputtering process is based on pulsed DC magnetron reactive sputtering technology. It primarily uses DC power supply for ignition of the plasma. The addition of a high frequency pulse of positive voltage to the cathode ensures that there is minimal build-up of insulating material on the cathode and thereby helps efficient operation of the plasma. Thereby the SP200 sputtering machine can be used to deposit insulating materials like oxides and nitrides from metal or doped semiconducting target material by the introduction of oxygen and nitrogen gas into the plasma. A magnetron assembly under the cathode enables efficient entrapment of plasma electrons above the cathode and thereby a more efficient plasma.

The target material used in the SP200 is typically Silicon. Small amounts of doping materials like aluminum or boron are commonly added to the target material. The target diameter is about 150 mm For the silicon target used typical power applied to the plasma is below 3 Kwatts and typically in the range of 2.0 to 2.5 Kwatts. The Voltage applied is in the range of 475-520 Volts. The voltage is pulsed at a frequency in the range of 50 to 100 KHz with the pulse duration between 1 to 3 microseconds. Argon is typically the working gas used for the plasma generation. Argon flow utilized is between 5 and 50 sccm. Reactive gases of oxygen and nitrogen are utilized with flow rate typically between 9 and 12 sccm to deposit an oxide or nitride or an oxynitride of silicon. Typical operating pressure is in the range of $1.0\times10^{-3}$ to $5.0\times10^{-3}$ mbar. With these operating conditions a low index silicon dioxide material can be deposited with index of 1.46 at 550 nm and high index silicon nitride material can be deposited with index of 1.94 at 550 nm. Deposition rate for silicon dioxide is in the range of 1.0 to 1.5 nm/sec and that for silicon nitride is in the range of 0.5 to 0.8 nm/sec.

The term "coupled" is defined as connected, although not necessarily directly, and not necessarily mechanically. The terms "a" and "an" are defined as one or more unless this disclosure explicitly requires otherwise. The term "substantially" is defined as being largely but not necessarily wholly what is specified (and include wholly what is specified) as understood by one of ordinary skill in the art. In any disclosed embodiment, the term "substantially" may be substituted with "within [a percentage] of" what is specified, where the percentage includes 0.1, 0.2, 0.3, 0.4, 0.5, 0.6, 0.7, 0.8, 0.9, 1, 2, 3, 4, 5, 6, 7, 8, 9, and 10 percent.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, {{give an example from the application of one thing that comprises another, e.g., a container assembly}} that "comprises," "has," "includes" or "contains" one or more elements possesses those one or more elements, but is not limited to possessing only those one or more elements. Likewise, an element of a system or composition that "comprises," "has," "includes" or "contains" one or more features possesses those one or more features, but is not limited to possessing only those one or more features.

Furthermore, a structure or composition that is configured in a certain way is configured in at least that way, but may also be configured in ways that are not listed. Metric units may be derived from the English units provided by applying a conversion and rounding to the nearest millimeter. The feature or features of one embodiment may be applied to other embodiments, even though not described or illustrated, unless expressly prohibited by this disclosure or the nature of the embodiments.

Any embodiment of any of the disclosed compositions and/or methods can consist of or consist essentially of—rather than comprise/include/contain/have—any of the described elements and/or features and/or steps. Thus, in any of the claims, the term "consisting of" or "consisting essentially of" can be substituted for any of the open-ended linking verbs recited above, in order to change the scope of a given claim from what it would otherwise be using the open-ended linking verb.

BRIEF DESCRIPTION OF THE DRAWINGS

The following drawing illustrate by way of example and not limitation.

DETAILED DESCRIPTION

Various features and advantageous details are explained more fully with reference to the non-limiting embodiments that are illustrated in the accompanying drawings and detailed in the following description. It should be understood, however, that the detailed description and the specific examples, while indicating embodiments of the invention, are given by way of illustration only, and not by way of limitation. Various substitutions, modifications, additions, and/or rearrangements will be apparent to those of ordinary skill in the art from this disclosure.

In the following description, numerous specific details are provided to provide a thorough understanding of the disclosed embodiments. One of ordinary skill in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

It has been found that an antireflective stack deposited by sputtering decreases reflection in the UV range and the visible range and offers improved thermomechanical properties as compared to evaporation-bases antireflective stacks.

The colorimetric coefficients (including hue and chroma) of the antireflective-coated ophthalmic lenses of the invention are defined in the international colorimetric system CIE L*a*b* 1976, using standard observer 10° and standard illuminant D65 and are calculated between 380 and 780 nm at an angle of incidence of 15°. When the stacks are applied on the convex side of the lenses only, the optical property measurements are made on the convex side to evaluate slight changes from theoretical (design target) to experimental values. It has been shown that the properties of stacks deposited either on the front or the back side are similar.

EXAMPLES

Lens Preparation

1. Lens Substrates

ORMA® lenses: Finished single vision uncoated plano lenses, 6 base, in ORMA® (polymer of diethylene glycol bis (allylcarbonate)). PC lenses: Finished single vision uncoated plano lenses, 6 base, in polycarbonate (PC). The PC lenses can be initially naked (uncoated) PC substrates or commercial PC lenses having initially a PDQ™ coating that is stripped before applying primer and/or hard coating. As classically known in the art, the base of a lens corresponds to the curvature (expressed in dioptries) of the front face of a lens base: base=530/R in mm (R=radius of curvature of the anterior surface of spectacle lens).

2. Primer Composition 2.1 List of Used Primers:

Primer 1: Witcobond® W234 aliphatic polyurethane dispersion.

Primer 2: high refractive polyurethane dispersion with a high refractive index colloid. Refractive index of the cured primer: 1.63.

2.2 Deposition Process of Primer

Both convex (Cx) and concave (Cc) sides of the lenses are coated in a dip coating process. Primer 1:

ORMA® or PC lenses as defined in 1) above, are first dipped in a bath of primer 1, then removed and heated at 75° C. for 16 minutes followed by 16 minutes ambient cooling before subsequent hard coat application. The thickness of the primer is 1.0±0.15 microns.

Primer 2:lenses are first dipped in a bath of primer 1, then removed and heated at 75° C. for 16 minutes followed by 16 minutes ambient cooling before subsequent hard coat application. The thickness of the primer is 0.8±0.10 microns.

3. Hard Coats 3.1 List of Used Hard Coats

Hard coat 1 (HC1): Hard coating composition corresponding to example 3 of EP614957 (refractive index of cured hard coat: 1.48).

Hard coat 2 (HC1): Commercial UV curable abrasion resistant coating—Hard coat HT850™ from LTI (refractive index of hard coat 2 is 1.515 at 550 nm).

Hard coat 3: High refractive index hard coat: (refractive index=1.595) (Used in examples of FIG. 1).

3.2 Deposition Process of Hard Coats 3.2.1 Process of Deposition of Hard Coat 1

Lenses that have been previously coated by primer 1 in 2.2 above are dipped in a bath of hard coat composition 1, removed and heated at a temperature of 75° C. for 16 minutes. The lenses are then post-cured in a standard curing DIMA™ oven at 115° C. for 25 minutes. After post-curing, the lenses are kept in a holding oven at 60° C. for 1-2 hours. The thickness of hard coat 1 is 3.6±0.4 microns.

Process of Deposition of Hard Coat 2 (HT850™)

Lenses are hand washed and then coated on Cx side only with HT850™ UV curable coating in a Magna-spin™ spin coating machine (available from Satisloh). The lenses were UV cured inside the Magna-spin machine. The UV dosage for curing is 1.1±0.1 J/cm$^2$. The thickness of hard coat 2 is 4.5±0.2 microns.

4. AR Stacks and Deposition Process

4.1-Deposition Process by Evaporation (Comparative)

The lenses are removed from the holding oven and put into a Balzers BAK760 AR coating chamber. AR stack1 (AR1) is deposited in this order:

34 nm $ZrO_2$ (layer closest to the lens substrate)
21 nm $SiO_2$
103 nm $ZrO_2$
79 nm $SiO_2$ (layer of the stack furthest from lens substrate)

| Step | Description | Starting Material | Deposition Rate, nm/s | Pressure mbar | Gas Flow | Ion Gun Parameters |
|---|---|---|---|---|---|---|
| 1 | Ion Plasma Clean/ Surface Preparation | None | None | $3 \times 10^{-5}$ | Argon (25 sccm) | 100 V, 1 A, 60 secs |
| 2 | Deposition $ZrO_2$ | ZrO | 0.35 | $8.0 \times 10^{-5}$ | Oxygen (10 sccm) | — |
| 3 | Deposition $SiO_2$ | $SiO_2$ | 0.60 | $7.0 \times 10^{-5}$ | None | — |
| 4 | Deposition $ZrO_2$ | ZrO | 0.30 | $7.0 \times 10^{-5}$ | Oxygen (10 sccm) | — |
| 5 | Deposition $SiO_2$ | $SiO_2$ | 1.0 | $7.0 \times 10^{-5}$ | None | — |

4.2 Sputtering Deposition Process

The lenses from steps 3.2.1 or 3.2.2 are put into a SP200™ sputter machine from Satisloh and are deposited according to the folllowing steps: If lenses are coated by hard coat 2, they are put into the sputtering machine immediately after they had been hard coated. Only the Cx side of the lenses was coated as all the following tests performed are done on Cx side of lenses.

The deposited stack is AR2
21 nm $Si_3N_4$ (1st layer in contact with hard coat)
16 nm $SiO_2$
109 nm $Si_3N_4$
73 nm $SiO_2$

| Step | Description | Starting Material | Deposition Rate, nm/s | Pressure mbar | Gas Flow, sccm | Plasma Parameters |
|---|---|---|---|---|---|---|
| 1 | Ion Plasma Clean/ Surface Preparation | None | None | $3 \times 10^{-3}$ | Argon: 25-50 | Power 1500 W Volt 340-380 V |
| 2 | Deposition $Si_3N_4$ | Silicon | 0.70-0.80 | $1.0 \times 10^{-3}$ | Nitrogen = 9-12.0 | Power 2000 W Volt 490-510 V |
| 3 | Deposition $SiO_2$ | Silicon | 1.15-1.30 | $1.0 \times 10^{-3}$ | Oxygen = 10.8-11.5 | Power 1500 W Volt 510-530 V |
| 4 | Deposition $Si_3N_4$ | Silicon | 0.70-0.80 | $1.0 \times 10^{-3}$ | Nitrogen = 9 to 12.0 | Power 2000 W Volt 490-510 V |
| 5 | Deposition $SiO_2$ | Silicon | 1.15-1.30 | $1.0 \times 10^{-3}$ | Oxygen = 10.8-11.5 | Power 1500 W Volt 510-530 V |

AR3: Deposited layers:
58 nm Silicon Oxynitride with index of 1.76 at 550 nm (1st layer in contact with hard coat)
96 nm $Si_3N_4$
73 nm $SiO_2$

| Step | Description | Starting Material | Deposition Rate, nm/s | Pressure mbar | Gas Flow, sccm | Plasma Parameters |
|---|---|---|---|---|---|---|
| 1 | Ion Plasma Clean/ Surface Preparation | None | None | $3 \times 10^{-3}$ | Argon = 50 | Power 1500 W Volt 340-380 V |
| 2 | Deposition $SiO_xN_y$ | Silicon | 0.75-0.85 | $1.0 \times 10^{-3}$ | Nitrogen = 8 to 9 and Oxygen = 1.8-2.1 | Power 2000 W Volt 490-510 V |
| 3 | Deposition $Si_3N_4$ | Silicon | 0.70-0.80 | $1.0 \times 10^{-3}$ | Nitrogen = 9 to 12.0 | Power 2000 W Volt 490-510 V |
| 4 | Deposition $SiO_2$ | Silicon | 1.15-1.30 | $1.0 \times 10^{-3}$ | Oxygen = 10.8-11.5 | Power 1500 W Volt 510-530 V |

AR4 Deposited layers:
18 nm $Si_3N_4$ (1st layer in contact with hard coat)
23 nm $SiO_2$
111 nm $Si_3N_4$
76 nm $SiO_2$
AR5 Deposited layers:
21 nm $Si_3N_4$ (1st layer in contact with hard coat)
11 nm $SiO_2$
111 nm $Si_3N_4$
77 nm $SiO_2$
AR4 and AR5 are deposited using the same process as AR2, with only the thickness differing.

5. Hydrophobic Coatings

OF210™ from Optron or Aulon™ from Satisloh are deposited on the previously applied AR.

Process of deposition of OF210™ (in a Balzers BAK760 AR coating chamber).

| Hydrophobic Layer Deposition | OF210 ™ | Rate ~0.1 nm/s (variable) | Pressure: $7.7 \times 10^{-6}$ mbar |
|---|---|---|---|

Process of deposition of Aulon™:

The hydrophobic layer used is Aulon™ M supplied by Satisloh. The hydrophobic layer comes impregnated in a single use disposable cloth tissue inside a sealed packet. For application the cloth tissue is removed from the packet and is applied by circular motion on the surface of the coated surface. Once a uniform layer is formed any additional hydrophobic forms beads on the surface. Hydrohobic coated lens surface is left at room temperature in open air for 15 minutes. After this the lens is rinsed under water and excess hydrophobic is washed off by using a mild soap.

Examples are prepared using different primer, hard coats and stacks. They are summarized in tables. 1 and 2 with their optical properties:

Effect of Hard Coat Index

Figure 1:
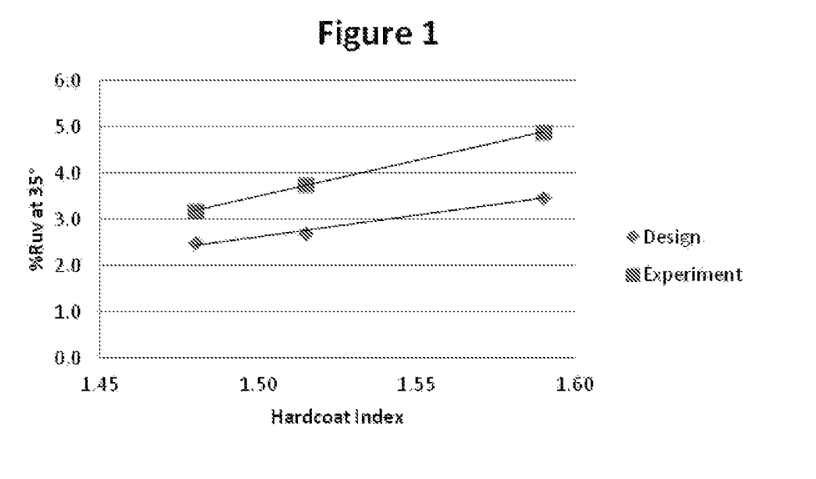
FIG. 1 is a graph wherein % Ruv values are reported as a function of hard coat refractive index.

Several coatings were prepared with variable hard coat index and the corresponding % Ruv values are reported as a function of hard coat index (FIG. 1). Lowering the index of the hard coat is beneficial to the Ruv.

Examples are prepared using different primers, hard coats and stacks. They are summarized in Table 3 with their critical temperature properties.

One of the improvements seen with the coated lenses of the invention using the sputtering process is higher critical temperature.

Critical Temperature Test

The lens is placed in an oven heated at a temperature of 50° C. for one hour. The lens is then removed from the oven and the appearance of the substrate is visually evaluated. When the substrate has no crack, the set temperature of the oven is increased by 10° C. and the test is repeated. The critical temperature is then defined as that at which the AR is cracked. Examples were prepared using different primer, hard coats and stacks. The table below lists the stacks and their mechanical properties:

TABLE 1

| | Substrate | Hard coat | sublayer | Stack | Deposition method | h (hue) | C (chroma) | Rv (%) | Ruv35° (%) |
|---|---|---|---|---|---|---|---|---|---|
| Example 1* (Design-target) | PC | HC2 | None | AR2 | | 147° | 9.3 | 1.31 | 2.75 |
| Example 1* (Experimental) | PC | HC2 | None | Idem Example 1 | Sputtering | 149° ± 6° | 7.8 ± 0.09 | 1.51 ± 0.08 | 3.76 ± 0.25 |
| Example 2* (Design-target) | PC | HC2 | None | AR2 | | 313° | 7.8 | 0.6 | 1.7 |
| Example 2* (Experimental) | PC | HC2 | None | Idem Example 2 | Sputtering | 321 ± 17° | 7.9 ± 1.6 | 1.2 ± 0.1 | 1.64 ± 0.12 |
| Example 3* (Design target) | PC | HC2 | Yes 100 nm thickness ($SiO_2$) | AR2 | | 140° | 9.6 | 0.93 | 2.33 |
| Example 3* (Experimental) | PC | HC2 | None | Idem Example 3 | Sputtering | 140 ± 8° | 8.2 ± 1.5 | 1.4 ± 0.2 | 3.4 ± 0.35 |
| Example 4* (Design target) | PC | HC2 | None | AR3 | | 140 | 10.4 | 1.3 | 3.7 |
| Example4* (Experimental) | PC | HC2 | None | Idem Example 4 | Sputtering | 147 ± 11° | 11.9 ± 0.9 | 1.56 ± 0.3 | 3.1 ± 0.74 |
| Comparative Example 1** | PC | HC2 | None | AR1 | Evaporation | 135 | 7 | 0.8 | 3.1 |

*Samples having an Aulon ™ hydrophobic top coat deposited in direct contact to the AR stack.
**Samples having an OF210 ™hydrophobic top coat deposited in direct contact with the AR stack

TABLE 2

| | Substrate | Hard coat | Sublayer | Stack | Deposition method | h (hue) | C (chroma) | Rv (%) | Ruv 35° (%) |
|---|---|---|---|---|---|---|---|---|---|
| Example 5* (Design-Target) | PC | HC2 | None | AR2 | | 147° | 9.3 | 1.31 | 2.75 |
| Example 5* (Experimental) | PC | HC2 | None | AR2 | Sputtering | 149° +/− 6° | 7.8 +/− 0.09 | 1.51 +/− 0.08 | 3.76 ± 0.25 |
| Example 6* (Design-Target)* | PC | Primer 1/ HC1 | None | AR4 | | 143° | 8.3 | 1.06 | 2.50 |

TABLE 2-continued

| | Substrate | Hard coat | Sublayer | Stack | Deposition method | h (hue) | C (chroma) | Rv (%) | Ruv 35° (%) |
|---|---|---|---|---|---|---|---|---|---|
| Example 6* (Experimental) | | Primer 1/ HC1 | None | AR4 | Sputtering | 131 ± 6.0 | 6.4 ± 0.70 | 0.92 ± 0.05 | 3.2 ± 0.16 |
| Example 7* | PC | Primer 2/ HC2 | None | AR5 | | 140° | 10.1 | 1.20 | 3.50 |
| Example 7* (Experimental) | PC | Primer 2/ HC2 | None | AR5 | Sputtering | 144 ± 6.0 | 8.8 ± 1.0 | 1.17 ± 0.12 | 4.90 |

*Samples having an Aulon ™ hydrophobic top coat deposited in direct contact to the AR stack.
**Samples having an OF210 ™hydrophobic top coat deposited in direct contact with the AR stack

TABLE 3

| Examples | Substrate | | AR | Process for AR deposition | Critical Temperature 1 week | Critical Temperature 3 weeks | Critical Temperature 5 weeks |
|---|---|---|---|---|---|---|---|
| Example 8 | ORMA ® | Primer 1/HC1 | AR2* | sputtering | 80° C. | 80° C. | |
| Comparative example 1 | ORMA ® | Primer 1/HC1 | AR1** | Evaporation | 50° C. | 50° C. | |
| Example 9 | ORMA ® | HC2 | AR2* | sputtering | 90° C. | | |
| Comparative Example 2 | ORMA ® | HC2 | AR1** | Evaporation | 80° C. | | |
| Example 10 | PC | Primer 1/HC1 | AR2* | Sputtering | | | 120° C. |
| Comparative example 3 | PC | Primer 1/HC1 | AR1** | Evaporation | | | 80° C. |

*Samples having an Aulon ™ hydrophobic top coat deposited in direct contact to the AR stack
**Samples having an OF210 ™hydrophobic top coat deposited in direct contact with the AR stack The critical temperature was evaluated with stacks on convex side only. (Critical temperature of the stacks on a back concave side are the same or very close).

RESULTS

One of the improvements seen with the coated lenses of the invention using the sputtering process is higher critical temperature.

Improved critical temperature was observed on PC HC1 with AR deposited by sputtering as compared to evaporation.

Critical temperature seen on Orma® substrate are shown above. Important differences are seen on Orma® with Primer 1+hard coat 1. On Orma® lenses with hard coat 2, the differences are lower but clearly significant. The improvement of critical temperature is very important on PC lenses.

This invention can be used by companies that are familiar with sputtering technology using the SP200 machine. The AR stack with sputtering can also be used in small labs with AR volumes of 100-200 lenses/day.

The claims are not to be interpreted as including means-plus- or step-plus-function limitations, unless such a limitation is explicitly recited in a given claim using the phrase(s) "means for" or "step for," respectively.

The invention claimed is:

1. An ophthalmic lens comprising: a transparent substrate with a front face and a rear face, the rear face being successively coated with a hard-coat having a refractive index less than or equal to 1.6, and a multilayered antireflective coating comprising a stack of at least one layer A having a refractive index $n_A$ less than 1.55, and of at least one layer B having a refractive index $n_B$ greater than or equal to 1.55, wherein the mean reflection factor Ruv on the rear face in the range 280 nm to 380 nm, weighted by the W(λ) function defined according to the ISO 13666:1998 standard, is less than or equal to 5% for an angle of incidence of 35°, and the multilayered antireflective coating has been deposited by sputtering, and wherein the ratio (sum of the physical thicknesses of the layers having a refractive index less than 1.55 in the multilayered antireflective coating/sum of the physical thicknesses of the layers having a refractive index equal to or greater than 1.55 in the multilayered antireflective coating) is less than 0.9, and wherein the multilayered antireflective coating the following layers listed in order of proximity to the hard coat: a first layer with a thickness ranging from 18-34 nm having a refractive index greater than 1.55; a second layer with a thickness ranging from 11-23 nm having a refractive index lower than or equal to 1.55; a third layer with a thickness ranging from 90-120 nm having a refractive index greater than 1.55; and a fourth layer with a thickness ranging from 65-80 nm having a refractive index lower than or equal to 1.55.

2. The ophthalmic lens according to claim 1, wherein the mean light reflection factor on the rear face in the visible region Rv, defined between 380 and 780 nm in the ISO 13666:1998 standard, is less than or equal to 2%.

3. The ophthalmic lens according to claim 2, wherein the mean light reflection factor on the rear face in the visible region Rv is ranging from 0.9% to 2%.

4. The ophthalmic lens according to claim 2, wherein the mean light reflection factor on the rear face in the visible region Rv is ranging from 1% to 2%.

5. The ophthalmic lens according to claim 1, wherein the multilayered antireflective coating has a hue angle ranging from 275° to 325° at an angle of incidence of 15°.

6. The ophthalmic lens according to claim 1, wherein a chroma of the multilayered antireflection coating is less than 15 for an angle of incidence of 15°.

7. The ophthalmic lens according to claim 1, wherein:
layer A is the outermost layer of the multilayered antireflective coating, layer B is adjacent to said layer A and the physical thickness of said outermost layer A is less than the physical thickness of said adjacent layer B.

8. The ophthalmic lens according to claim 1, further comprising a sublayer adjacent to the multilayered antireflective coating having a refractive index nsub less than 1.55.

9. The ophthalmic lens according to claim 1, wherein layer A comprises at least one oxide chosen from silicon oxides and mixtures of silicon oxides and aluminum oxide.

10. The ophthalmic lens according to claim 1, wherein layer B comprises at least one material selected from the group consisting of zirconia ($ZrO_2$), titanium dioxide ($TiO_2$), tantalum pentoxide ($Ta_2O_5$), niobium oxide ($Nb_2O_5$), alumina ($Al_2O_3$), praseodymium oxide ($Pr_2O_3$), praseodymium titanate ($PrTiO_3$), silicon nitride.

11. The ophthalmic lens according to claim 10, wherein layer B comprises $Si_3N_4$.

12. The ophthalmic lens according to claim 1, further comprising a layer C having a refractive index $n_C$, wherein layers A, B and C are adjacent in that order and $n_C$ is greater than 1.55 and less than $n_B$.

13. The ophthalmic lens according to claim 1, having a critical temperature greater than or equal to 60° C.

14. The ophthalmic lens according to claim 1, further comprising a hard-coat having a refractive index less than 1.55.

15. The ophthalmic lens according to claim 1, further comprising a hard-coat having a refractive index less than 1.5.

16. The ophthalmic lens according to claim 1, wherein layer A comprises at least one oxide chosen from silica or a mixture of silica and aluminum oxide.

17. The ophthalmic lens according to claim 1, wherein multilayered antireflective coating comprises the following layers listed in order of proximity to the hard coat:

a first layer with a thickness ranging from 18-25 nm having a refractive index greater than 1.55;
a second layer with a thickness ranging from 15-20 nm having a refractive index lower than or equal to 1.55;
a third layer with a thickness ranging from 90-120 nm having a refractive index greater than 1.55; and a fourth layer with a thickness ranging from 65-80 nm having a refractive index lower than or equal to 1.55.

18. A method for manufacturing an ophthalmic lens comprising the steps of:
providing a transparent substrate with a front face and a rear face;
applying on the rear face a hard-coat having a refractive index less than or equal to 1.6 and depositing by sputtering a multilayered antireflective coating comprising a stack of at least one layer A having a refractive index $n_A$ less than or equal to 1.55 and of at least one layer B having a refractive index $n_B$ greater than 1.55; and
obtaining said ophthalmic lens having a mean reflection factor in the range 280 nm to 380 nm on the rear face that is less than or equal to 5% for an angle of incidence of 35°;
wherein the ratio (sum of the physical thicknesses of the layers having a refractive index less than 1.55 in the multilayered antireflective coating/sum of the physical thicknesses of the layers having a refractive index equal to or greater than 1.55 in the multilayered antireflective coating) is less than 0.9, and wherein the multilayered antireflective coating the following layers listed in order of proximity to the hard coat: a first layer with a thickness ranging from 18-34 nm having a refractive index greater than 1.55; a second layer with a thickness ranging from 11-23 nm having a refractive index lower than or equal to 1.55; a third layer with a thickness ranging from 90-120 nm having a refractive index greater than 1.55; and
a fourth layer with a thickness ranging from 65-80 nm having a refractive index lower than or equal to 1.55.

* * * * *